United States Patent [19]

Yamazaki

[11] Patent Number: 5,516,709
[45] Date of Patent: May 14, 1996

[54] METHOD OF MANUFACTURING BIPOLAR TRANSISTOR WITH REDUCED NUMBERS OF STEPS WITHOUT INCREASING COLLECTOR RESISTANCE

[75] Inventor: Toru Yamazaki, Tokyo, Japan

[73] Assignee: NEC Corporation, Tokyo, Japan

[21] Appl. No.: 346,163

[22] Filed: Nov. 21, 1994

[30] Foreign Application Priority Data

Nov. 22, 1993 [JP] Japan .................................. 5-315851

[51] Int. Cl.⁶ .................................................. H01L 21/265
[52] U.S. Cl. .............................. 437/31; 437/26; 437/33; 437/38; 437/162; 437/192; 437/200; 437/203; 148/DIG. 10; 148/DIG. 11; 148/DIG. 124; 257/197; 257/565; 257/586
[58] Field of Search ............................... 437/31, 26, 38, 437/33, 162, 192, 200, 203; 148/DIG. 10, DIG. 11, DIG. 124; 257/197, 565, 586

[56] References Cited

U.S. PATENT DOCUMENTS

| 4,965,217 | 10/1990 | Desilets et al. | 437/203 |
|---|---|---|---|
| 4,983,532 | 1/1991 | Mitani et al. | 48/DIG. 11 |
| 5,034,338 | 7/1991 | Neppl et al. | 437/203 |
| 5,096,843 | 3/1992 | Kodaira | 437/31 |
| 5,358,882 | 10/1994 | Bertagnolli et al. | 437/31 |
| 5,424,227 | 6/1995 | Dietrich et al. | 437/200 |

FOREIGN PATENT DOCUMENTS

| 0089457 | 5/1984 | Japan | 437/31 |
|---|---|---|---|
| 3-49256 | 3/1991 | Japan . | |
| 3229425 | 10/1991 | Japan | 437/31 |
| 4-269835 | 9/1992 | Japan . | |

Primary Examiner—George Fourson
Assistant Examiner—Long Pham
Attorney, Agent, or Firm—Popham, Haik, Schnobrich & Kaufman, Ltd.

[57] ABSTRACT

A method of manufacturing a bipolar transistor including the steps of doping an impurity of the one conductivity type in a major surface portion of the semiconductor substrate to form a buried layer of the one conductivity type and growing an epitaxial layer on an entire surface on a major surface of the semiconductor substrate, forming a diffusion region of the opposite conductivity type in an emitter formation region on the major surface of the semiconductor substrate and forming a base connecting region in a base formation region to be in contact with the diffusion region of the opposite conductivity type, forming an insulating interlayer on the major surface of the semiconductor substrate including the diffusion region of the opposite conductivity type and the base connecting region, forming an emitter electrode layer contact hole reaching the diffusion region of the opposite conductivity type in an emitter formation region of the insulating interlayer and forming a collector region hole reaching the epitaxial layer in a collector formation region of the insulating interlayer, depositing a polysilicon film on the insulating interlayer and in the emitter electrode layer contact hole and the collector region hole, forming a patterning mask on the polysilicon film in the emitter formation region, patterning the patterning mask to leave a polysilicon film serving as an emitter electrode layer, and, at the same time, removing the epitaxial layer in the collector formation region by etching to form a collector groove.

4 Claims, 21 Drawing Sheets

METHOD OF MANUFACTURING BIPOLAR TRANSISTOR WITH REDUCED NUMBERS OF STEPS WITHOUT INCREASING COLLECTOR RESISTANCE

BACKGROUND OF THE INVENTION

1. Field of the Invention

The present invention relates to a semiconductor device and a method of manufacturing the same and, more particularly, to a bipolar transistor and a method of manufacturing the same.

2. Description of the Prior Art

FIG. 1 is a sectional view showing a bipolar transistor according to the first prior art.

Referring to FIG. 1, reference numeral 1 denotes a p-type semiconductor substrate; 2, an n-type buried layer; 3, a p-type buried layer 3; 4, an n-type epitaxial layer; 5, a p-type well; 6, a field oxide film; 7, a p-type diffusion region; 8, a p-type base connecting region; 9, an insulating interlayer; 10, an n-type collector diffusion region; 11, an emitter electrode layer; 12, an n-type emitter region; 13, an insulating interlayer; 14, an insulating interlayer; 17b, a base wiring layer; 17c, a collector wiring layer; 17e, an emitter wiring layer; 101, an emitter electrode layer contact hole; 102b, a base contact hole; 102c, a collector contact hole; 102e, an emitter contact hole; and 201, an oxide film.

The bipolar transistor is arranged on the major surface of the p-type semiconductor substrate 1 and isolated from other elements by the p-type buried layer 3 and the p-type well 5. This bipolar transistor is constituted by an npn transistor having a vertical structure obtained by sequentially, vertically arranging the active regions of an n-type collector region, a p-type base region, and an n-type emitter region upward from the major surface of the p-type semiconductor substrate 1.

The n-type collector region is constituted by the n-type collector diffusion region 10, the n-type epitaxial layer 4, and the n-type buried layer 2. The p-type base region is constituted by the p-type diffusion region 7 serving as an intrinsic base region and the p-type base connecting region 8 externally connecting to a base. The n-type emitter region 12 is formed by diffusing an n-type impurity to the major surface portion of the p-type diffusion region 7 serving as the intrinsic base region. The emitter electrode layer contact hole 101 is formed by removing the insulating interlayer 9 on the n-type emitter region 12, and the emitter electrode layer 11 is formed in the emitter electrode layer contact hole 101. The emitter electrode layer 11 is constituted by, e.g., a polysilicon layer, and an n-type impurity is doped in the emitter electrode layer 11.

The base contact hole 102b is formed by removing the oxide film 201 and the insulating interlayers 9, 13, and 14 on the p-type base connecting region 8, and the base wiring layer 17b is formed in the base contact hole 102b. The emitter contact hole 102e is formed by removing the insulating interlayers 13 and 14 on the emitter electrode layer 11, and the emitter wiring layer 17e is formed in the emitter contact hole 102e. In addition, the collector contact hole 102c is formed by removing the oxide film 201 and the insulating interlayers 9, 13, and 14 on the n-type collector diffusion region 10, and the collector wiring layer 17c is formed in the collector contact hole 102c. The base wiring layer 17b, the emitter wiring layer 17e, and the collector wiring layer 17c consist of, e.g., an aluminum alloy.

The steps of manufacturing the bipolar transistor shown in FIG. 1 will be described below with reference to FIGS. 2 to 5.

As shown in FIG. 2, an n-type impurity is doped in the bipolar transistor formation region of the major surface portion of the p-type semiconductor substrate 1, and a p-type impurity is doped in the isolation region of the major surface portion of the p-type semiconductor substrate 1. The n-type epitaxial layer 4 is grown on the entire surface on the major surface of the p-type semiconductor substrate 1. In the same process as this growth process, the n-type buried layer 2 is formed by the n-type impurity doped in the bipolar transistor formation region of the major surface portion of the p-type semiconductor substrate 1, and the p-type buried layer 3 is formed by the p-type impurity doped in the isolation region of the major surface portion of the p-type semiconductor substrate 1.

A p-type impurity such as boron is doped in a portion of the n-type epitaxial layer 4 on the p-type buried layer 3 by ion implantation or the like to form the p-type well 5. The oxide film 201 is formed on the entire major surfaces of the n-type epitaxial layer 4 and the p-type well 5, and a nitride film 202 is formed on the entire surface of the oxide film 201. The nitride film 202 is selectively left in the base, collector, emitter formation regions of the bipolar transistor by a photolithographic technique.

FIG. 3 shows the step following the step in FIG. 2.

Subsequently, the major surface of the n-type epitaxial layer 4 is thermally oxidized using the nitride film 202 as an anti-oxidant mask to form the field oxide film 6. Thereafter, the nitride film 202 is removed.

Phosphorus is ion-implanted in the resultant structure at an acceleration energy of 70 keV and a dose of $1\times10^{16}$ cm$^{-2}$ using, e.g., a photoresist film as a mask to dope an n-type impurity in the collector formation region of the bipolar transistor in the n-type epitaxial layer 4, thereby forming the n-type collector diffusion region 10 for extracting a collector potential. Thereafter, the resultant structure is annealed in a nitrogen atmosphere at 950° C. for 30 minutes to activate the n-type collector diffusion region 10 and to diffuse the n-type impurity to cause the n-type collector diffusion region 10 to reach the n-type buried layer 2.

FIG. 4 shows the step following the step shown in FIG. 3.

Subsequently, boron is ion-implanted in the resultant structure at an acceleration energy of 20 keV and a dose of $5\times10^{13}$ cm$^{-2}$ using, e.g., a photoresist as a mask to dope a p-type impurity in the emitter formation region of the bipolar transistor in the n-type epitaxial layer 4, thereby forming the p-type diffusion region 7 serving as an intrinsic base region. This p-type diffusion region 7 is formed to have a junction depth of, e.g., about 150 to 200 nm.

Next, BF$_2$ is ion-implanted in the resultant structure at an acceleration energy of 70 keV and a dose of $5\times10^{15}$ cm$^{-2}$ using, e.g., a photoresist as a mask to dope a p-type impurity in the base formation region of the bipolar transistor in the n-type epitaxial layer 4, thereby forming the p-type base connecting region 8. The resultant structure is annealed at 900° C. for 20 minutes to recover damage occurring in the above ion implantation and activate the doped p-type impurity.

FIG. 5 shows the step following the step shown in FIG. 4.

Subsequently, the insulating interlayer 9 is formed on the entire surfaces of the oxide film 201 and the field oxide film 6. This insulating interlayer 9 is constituted by an oxide film deposited by, e.g., a CVD method. The insulating interlayer 9 and the oxide film 201 in the emitter formation region of the bipolar transistor are etched by a photolithographic technique to form the emitter electrode layer contact hole 101. This etching is performed by anisotropic etching such as RIE.

A polysilicon film having a thickness of about 200 nm is deposited on the insulating interlayer 9 and in the emitter electrode layer contact hole 101 by, e.g., a CVD method. The deposited polysilicon film is patterned using a photolithographic technique, and the remaining polysilicon film is used as the emitter electrode layer 11.

Next, for example, arsenic is ion-implanted in the resultant structure at an acceleration energy of 70 keV and a dose of $1\times10^{16}$ $cm^{-2}$ to dope an n-type impurity in the emitter electrode layer 11. Thereafter, the resultant structure is annealed in, e.g., a nitrogen atmosphere at 900° C. for 20 minutes to diffuse the n-type impurity doped in the emitter electrode layer 11 to the major surface portion of the p-type diffusion region 7, thereby forming the n-type emitter region 12.

Subsequently, as shown in FIG. 1, the insulating interlayers 13 and 14 are formed on the entire surfaces of the insulating interlayer 9 and the emitter electrode layer 11. The insulating interlayers 13 and 14 are formed as a film having a two-layered structure obtained by sequentially stacking, e.g., an oxide film and a BPSG (borophosphosilicate glass) film.

In the base formation region of the bipolar transistor, the insulating interlayer 14, the insulating interlayer 13, the insulating interlayer 9, and the oxide film 201 are etched using a photolithographic technique to form the base contact hole 102b. In the emitter formation region of the bipolar transistor, the insulating interlayer 14 and the insulating interlayer 13 are etched using a photolithographic technique to form the emitter contact hole 102e. In addition, in the collector formation region of the bipolar transistor, the insulating interlayer 14, the insulating interlayer 13, the insulating interlayer 9, and the insulating interlayer 201 are etched using a photolithographic technique to form a collector contact hole 102c.

An aluminum alloy is deposited in the base contact hole 102b, the emitter contact hole 102e, and the collector contact hole 102c by, e.g., a sputtering method to form the base wiring layer 17b, the emitter wiring layer 17e, and the collector wiring layer 17c.

The collector electrode of the bipolar transistor obtained by the manufacturing method of the first prior art described above can be set to be 100 Ω or less because the n-type collector diffusion region 10 for extracting a collector potential is formed.

In addition, as a method of positively decreasing a collector resistance, as disclosed in Japanese Unexamined Patent Publication Nos. Hei 3-49256 and Hei 4-269835, methods of forming a groove in the collector formation region of a bipolar transistor and burying the groove with a polysilicon film are proposed.

The semiconductor device disclosed in Japanese Unexamined Patent Publication No. Hei 3-49256 is a BiCMOS device, having a bipolar transistor and a CMOS mounted on the same chip, in which the collector resistance of the bipolar transistor is reduced while the BiCMOS device is kept small in size. As the second prior art, this device will be described below.

FIG. 6 is a sectional view for explaining the structure of the semiconductor device disclosed in Japanese Unexamined Patent Publication No. Hei 3-49256 as the second embodiment and the steps in manufacturing the semiconductor device.

Referring to FIG. 6, reference numeral 91 denotes a p-type silicon substrate; 92a and 92b, n-type impurity diffusion layers; 93, a p-type epitaxial layer; 94, an n-type well; 95, a gate electrode of a CMOS portion; 96, a source/drain of the p-channel transistor of the CMOS portion; 97, a source/drain of the n-channel transistor of the CMOS portion; 98, the emitter portion of a bipolar transistor; 99, the base portion of the bipolar transistor; 910, the collector portion of the bipolar transistor; 915, an insulating interlayer; 921, a collector groove; and 922, an n-type impurity diffusion layer.

FIG. 7 shows the step following the step shown in FIG. 6.

The same reference numerals as in FIG. 6 denote the same parts in FIG. 7. Referring to FIG. 7, reference numeral 911 denotes a polysilicon layer.

FIG. 8 shows the step following the step shown in FIG. 7.

The same reference numerals as in FIG. 6 denote the same parts in FIG. 8. In FIG. 8, reference numerals 96a, 97a, 98a, 99a, and 910a denote contact holes, respectively.

A method of manufacturing the semiconductor device disclosed in Japanese Unexamined Patent Publication No. Hei 3-49256 will be described below with reference to FIGS. 6, 7 and 8.

As shown in FIG. 6, the collector groove 921 reaching the n-type impurity diffusion layer 92a is formed in the collector portion 910 of the bipolar transistor by the well-known photoetching method, an n-type impurity (e.g., phosphorus) is diffused to the side surface portion and bottom surface portion of the collector groove 921 by a thermal diffusion method to form the n-type impurity diffusion layer 922. Thereafter, the resultant structure is annealed at a temperature of 900° to 1,000° C. to anneal the insulating interlayer 915 consisting of PSG (phosphosilicate glass) and activate the n-type impurity diffusion layer 922.

As shown in FIG. 7, polysilicon is deposited by a CVD method to form the polysilicon layer 911. As shown in FIG. 8, the entire surface of the polysilicon layer 911 is etched to leave only the polysilicon layer 911 deposited in the collector groove 921 and to form the CMOS contact holes 96a and 97a and the emitter and base contact holes 98a and 99a of the bipolar transistor.

In the second prior art, according to the above manufacturing method, the collector portion 910 of the bipolar transistor is constituted by the collector groove 921 extending from the surface of the n-type epitaxial layer 94 to the n-type impurity diffusion layer 92a, the n-type impurity diffusion layer 922 formed along the side and bottom surface portions of the collector groove 921, and the polysilicon layer 911 buried in the collector groove 921.

As described above, according to the first prior art, the collector resistance of the bipolar transistor can be generally set to be 100 Ω or less because the n-type collector diffusion region 10 for extracting a collector potential is formed. However, as is apparent from the above manufacturing steps, the step of forming a photomask, and the step of implanting ions are required to form the n-type collector diffusion region 10. Therefore, in order to reduce the number of steps in manufacturing a bipolar transistor, as shown in FIG. 9, the step of forming the n-type collector diffusion region 10 is omitted, and the collector structure having no n-type collector diffusion region 10 is formed. In this case, however, the collector resistance becomes 100 Ω or more to be easily saturated, or other transistor characteristics are degraded. Reference numerals as in FIG. 1 denote the same parts in FIG. 9.

In the second prior art described above, the step of forming a photomask for forming the collector groove 921, the step of burying the polysilicon layer 911 in the collector groove 921, and the like are required, thereby increasing the number of manufacturing steps. In addition, since the step of forming the contact hole (collector groove) 921 in the collector portion 910 and the step of respectively forming the contact hole 98a and the contact hole 99a in the emitter and base portions must be performed as separate steps, the number of manufacturing steps cannot be reduced.

SUMMARY OF THE INVENTION

The present invention has been made in consideration of the above points, and has as its object to reduce the number of steps in manufacturing a bipolar transistor without increasing the collector resistance of the bipolar transistor.

In order to achieve the above object, there is provided a method of manufacturing a bipolar transistor having a collector of one conductivity type, a base of an opposite conductivity type, and an emitter of the one conductivity type which are formed on a semiconductor substrate, comprising the steps of doping an impurity of the one conductivity type in a major surface portion of the semiconductor substrate to form a buried layer of the one conductivity type and growing an epitaxial layer on an entire surface on a major surface of the semiconductor substrate, forming a diffusion region of the opposite conductivity type in an emitter formation region on the major surface of the semiconductor substrate and forming a base extracting region in a base formation region to be in contact with the diffusion region of the opposite conductivity type, forming an insulating interlayer on the major surface of the semiconductor substrate including the diffusion region of the opposite conductivity type and the base connecting region, forming an emitter electrode layer contact hole reaching the diffusion region of the opposite conductivity type in an emitter formation region of the insulating interlayer and forming a collector region hole reaching the epitaxial layer in a collector formation region of the insulating interlayer, depositing a polysilicon film, on the insulating interlayer and in the emitter electrode layer contact hole and the collector region hole, forming a patterning mask on the polysilicon film in the emitter formation region, patterning the patterning mask to leave a polysilicon film serving as an emitter electrode layer, and, at the same time, removing the epitaxial layer in the collector formation region by etching to form a collector groove, and doping an impurity of the one conductivity type in the emitter electrode layer and then diffusing the impurity of the one conductivity type to a major surface portion of the diffusion region of the opposite conductivity type to form an emitter region, and doping an impurity of the one conductivity type in at least a bottom surface portion of the collector groove and then diffusing the impurity of the one conductivity to the epitaxial layer to form a collector diffusion region.

According to the present invention, since patterning of the emitter electrode layer and formation of the collector groove can be simultaneously performed by the above method, the number of steps in manufacturing the bipolar transistor can be reduced without increasing the collector resistance of the bipolar transistor.

DETAILED DESCRIPTION OF THE PREFERRED EMBODIMENTS

Figure 10:
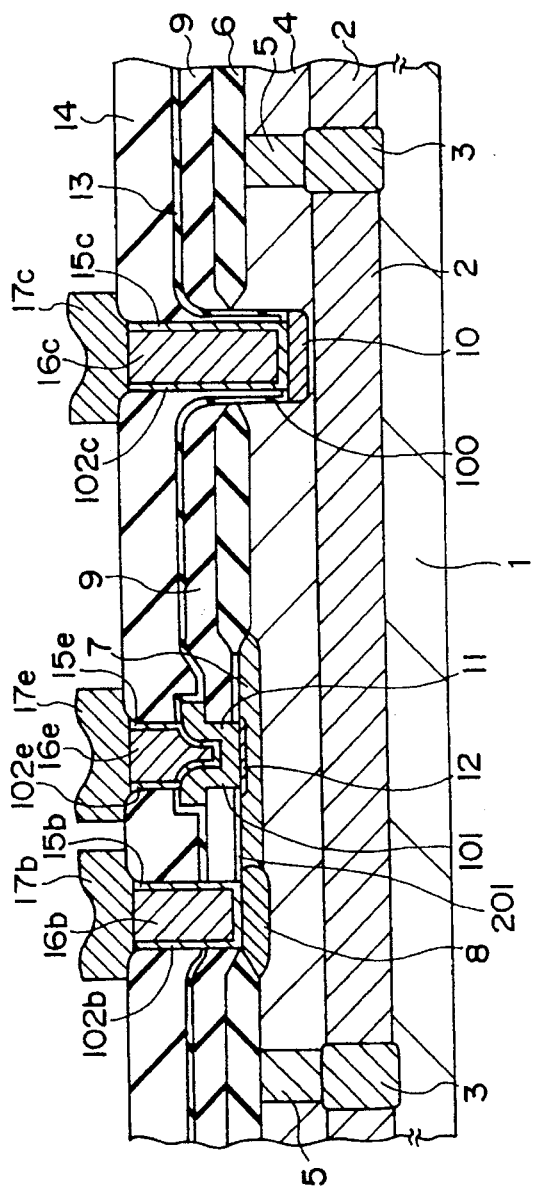
FIG. 10 is a sectional view showing a bipolar transistor according to the first embodiment of the present invention.
Figure 11:
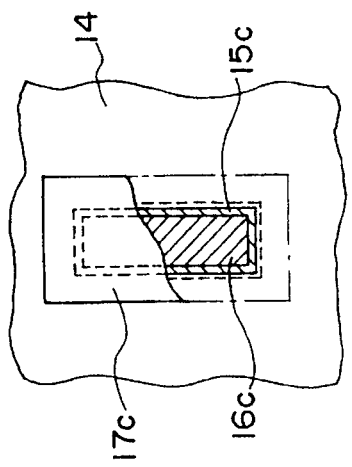
FIG. 11 is a plan view of the collector region of the bipolar transistor shown in FIG. 10.

The present invention will be described below with reference to the accompanying drawings, FIG. 10 is a sectional view showing the structure of a bipolar transistor according to the first embodiment of the present invention and FIG. 11 is a plan view of the collector region of the bipolar transistor shown in FIG. 10.

Referring to FIG. 10, reference numeral 1 denotes a p-type semiconductor substrate; 2, an n-type buried layer; 3, a p-type buried layer; 4, an n-type epitaxial layer; 5, a p-type well; 6, a field oxide film; 7, a p-type diffusion region; 8, a p-type base connecting region; 9, an insulating interlayer; 10, an n-type collector diffusion region; 11, an emitter electrode layer; 12, an n-type emitter region; 13, an insulating interlayer; 14, an insulating interlayer; 15b, a base adhering layer; 15c, a collector adhering layer; 15e, an emitter adhering layer; 16b, a base-buried tungsten layer; 16c, a collector-buried tungsten layer; 16e, an emitter-buried tungsten layer; 17b, a base wiring layer; 17c, a collector wiring layer; 17e, an emitter wiring layer; 100, a collector groove; 101, an emitter electrode layer contact hole; 102b, a base contact hole; 102c, a collector contact hole; 102e, an emitter contact hole; and 201, an oxide film.

The bipolar transistor is arranged on the major surface of the p-type semiconductor substrate 1 and isolated from other elements by the p-type buried layer 3 and the p-type well 5. This bipolar transistor is constituted by an npn transistor having a vertical structure obtained by sequentially, vertically arranging the active regions of an n-type collector region, a p-type base region, and an n-type emitter region upward from the major surface of the p-type semiconductor substrate 1.

The n-type collector region is constituted by the n-type collector diffusion region 10 formed in the bottom surface portion of the collector groove 100 formed in the major surface of the n-type epitaxial layer 4, the n-type epitaxial layer 4, and the n-type buried layer 2. In addition, the p-type base region is constituted by the p-type diffusion region 7 serving as an intrinsic base region and the p-type base connecting region 8 for externally extracting a base. The n-type emitter region 12 is formed by diffusing an n-type impurity to the major surface portion of the p-type diffusion region 7 serving as the intrinsic base region. The emitter electrode layer contact hole 101 is formed by removing the insulating interlayer 9 on the n-type emitter region 12, and the emitter electrode layer 11 is formed in the emitter electrode layer contact hole 101. The emitter electrode layer 11 is constituted by, e.g., a polysilicon layer, and an n-type impurity is doped in the emitter electrode layer 11.

The base contact hole 102b is formed by removing the oxide film 201 and the insulating interlayers 9, 13, and 14 on the p-type base connecting region 8, and the base adhering layer 15b and the base-buried tungsten layer 16b are buried in the base contact hole 102b. The base wiring layer 17b is formed.

The emitter contact hole 102e is formed by removing the insulating interlayers 13 and 14 on the n-type emitter diffusion region 11, and the emitter adhering layer 15e and the emitter-buried tungsten layer 16e are buried in the emitter contact hole 102e. The emitter wiring layer 17e is formed.

The collector contact hole 102c is formed by removing the insulating interlayers 13 and 14 on the n-type collector diffusion region 10, and the collector adhering layer 15c and the collector-buried tungsten layer 16c are buried in the collector contact hole 102c. The collector wiring layer 17c is formed.

The base adhering layer 15b, the emitter adhering layer 15e, and the collector adhering layer 15c consist of a metal such as Ti, TiW, or W, and the base wiring layer 17b, the emitter wiring layer 17e, and the collector wiring layer 17c consist of, e.g., an aluminum alloy.

The steps in manufacturing the bipolar transistor shown in FIG. 10 will be described below.

Figure 12:
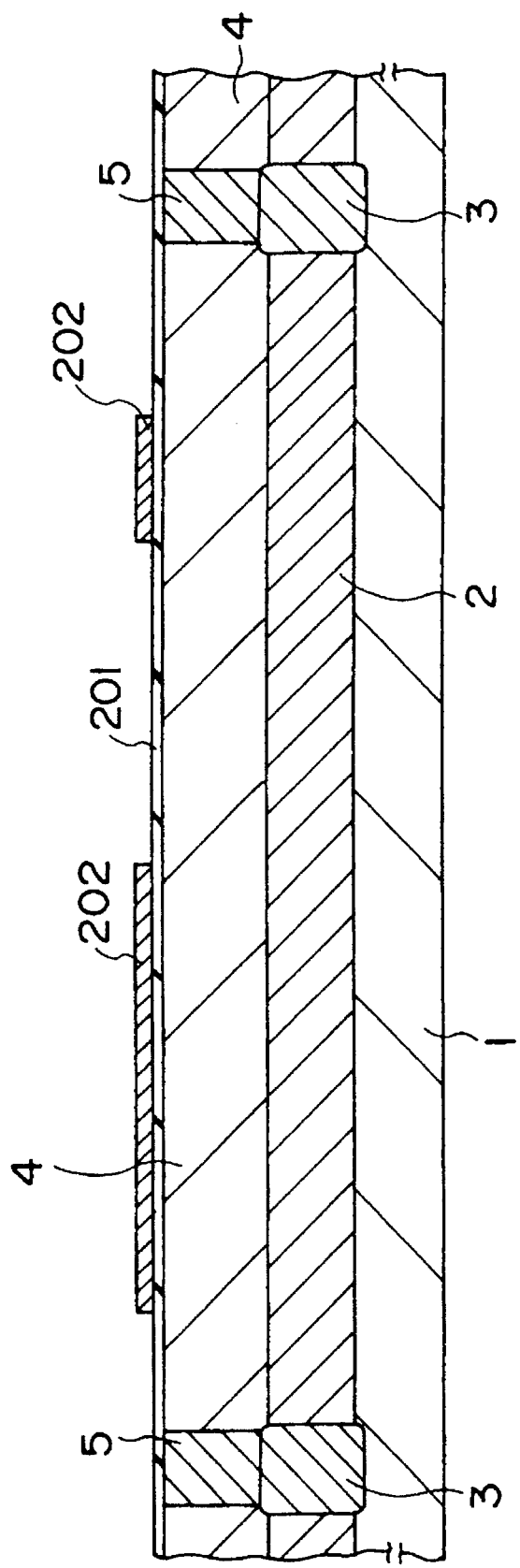
FIG. 12 is a sectional view for explaining a step in manufacturing the bipolar transistor shown in FIG. 10.

FIG. 12 is a sectional view for explaining a step in manufacturing the bipolar transistor shown in FIG. 10.

An n-type impurity is doped in the bipolar transistor formation region of the major surface portion of the p-type semiconductor substrate 1, and a p-type impurity is doped in the isolation region of the major surface portion of the p-type semiconductor substrate 1. The n-type epitaxial layer 4 is grown on the entire surface of the major surface of the p-type semiconductor substrate 1. In the same process as this growth process, the n-type buried layer 2 is formed by the n-type impurity doped in the bipolar transistor formation region of the major surface portion of the p-type semiconductor substrate 1, and the p-type buried layer 3 is formed by the p-type impurity doped in the isolation region of the major surface portion of the p-type semiconductor substrate 1.

A p-type impurity such as boron is doped in a portion of the n-type epitaxial layer 4 on the p-type buried layer 3 by ion implantation or the like using, a photoresist film as a mask. The oxide film 201 is formed on the entire major surfaces of the n-type epitaxial layer 4 and the p-type well 5, and a nitride film 202 is formed on the oxide film 201. The nitride film 202 is selectively left in only the base, collector, and emitter formation regions by a photolithographic technique.

Figure 13:
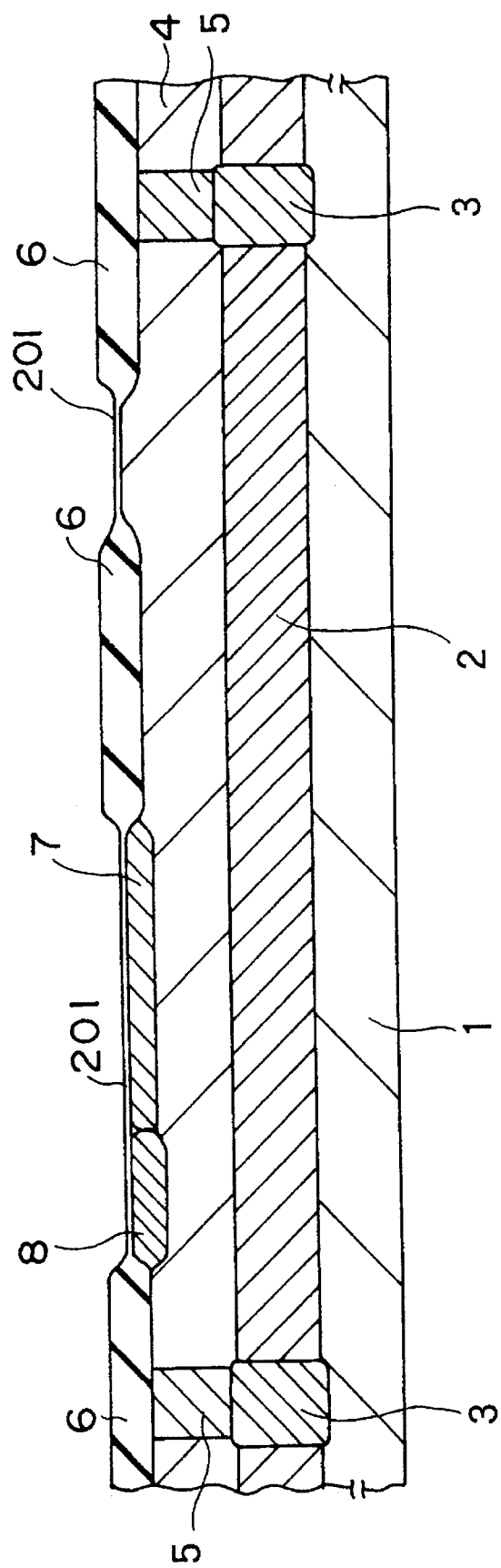
FIG. 13 is a sectional view for explaining a step in manufacturing the bipolar transistor shown in FIG. 10 and shows the step following the step shown in FIG. 12.

FIG. 13 shows the step following the step in FIG. 12.

Subsequently, the major surface of the n-type epitaxial layer 4 is thermally oxidized using the nitride film 202 as an anti-oxidant mask to form the field oxide film 6. Thereafter, the nitride film 202 is removed.

Boron is ion-implanted in the resultant structure at an acceleration energy of 20 keV and a dose of $5 \times 10^{13}$ cm$^{-2}$ using, e.g., a photoresist film as a mask to dope a p-type impurity in the emitter formation region of the bipolar transistor in the n-type epitaxial layer 4, thereby forming the p-type diffusion region 7 serving as an intrinsic base region. This p-type diffusion region 7 is formed to have a junction depth of, e.g., about 150 to 200 nm.

Next, BF$_2$ is ion-implanted in the resultant structure at an acceleration energy of 70 keV and a dose of $5 \times 10^{15}$ cm$^{-2}$ using, e.g., a photoresist as a mask to dope a p-type impurity in the base formation region of the bipolar transistor in the n-type epitaxial layer 4, thereby forming the p-type base connecting region 8. This p-type base connecting region 8 is formed to have a junction depth of, e.g., about 500 nm.

Thereafter, the photoresist films are removed, and the resultant structure is annealed at 900° C. for 20 minutes to recover damage occurring in the above ion implantation and activate the doped p-type impurity.

Figure 1:
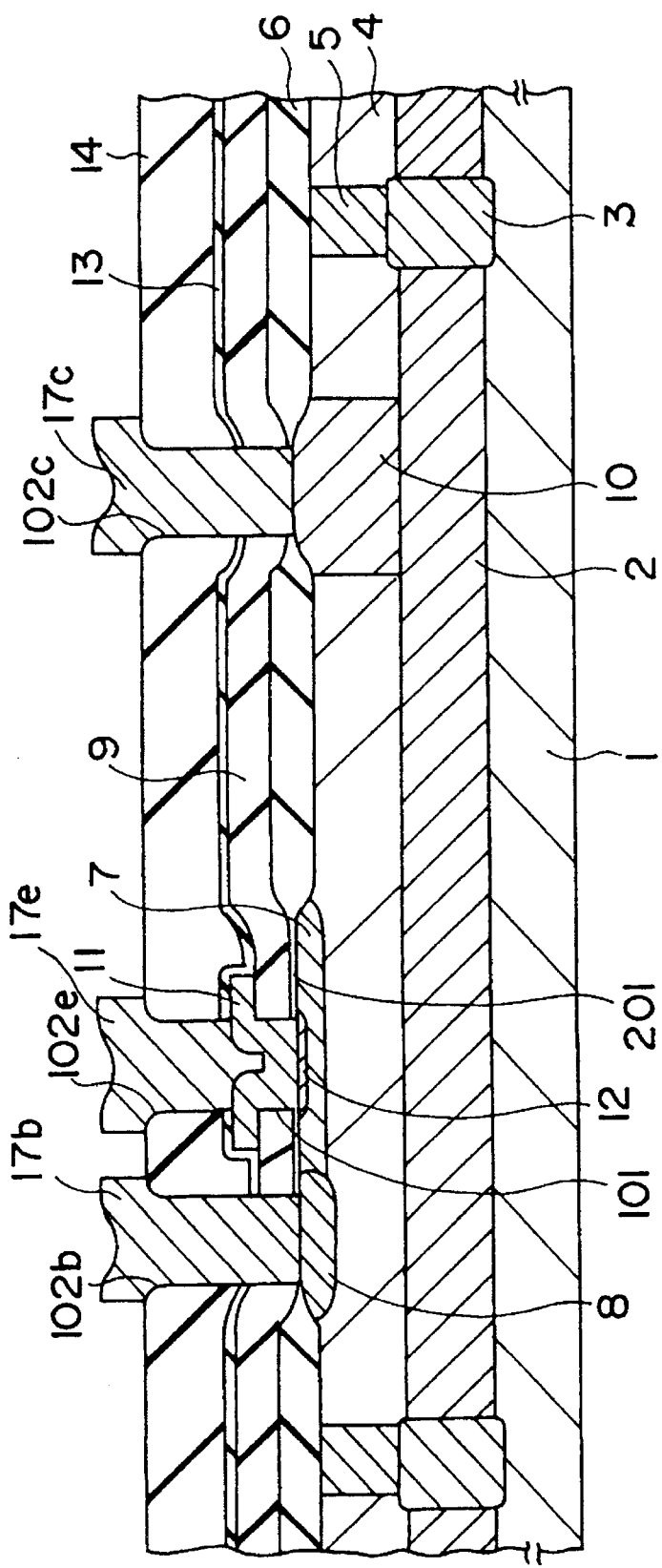
FIG. 1 is a sectional view showing a bipolar transistor according to the first prior art.
Figure 2:
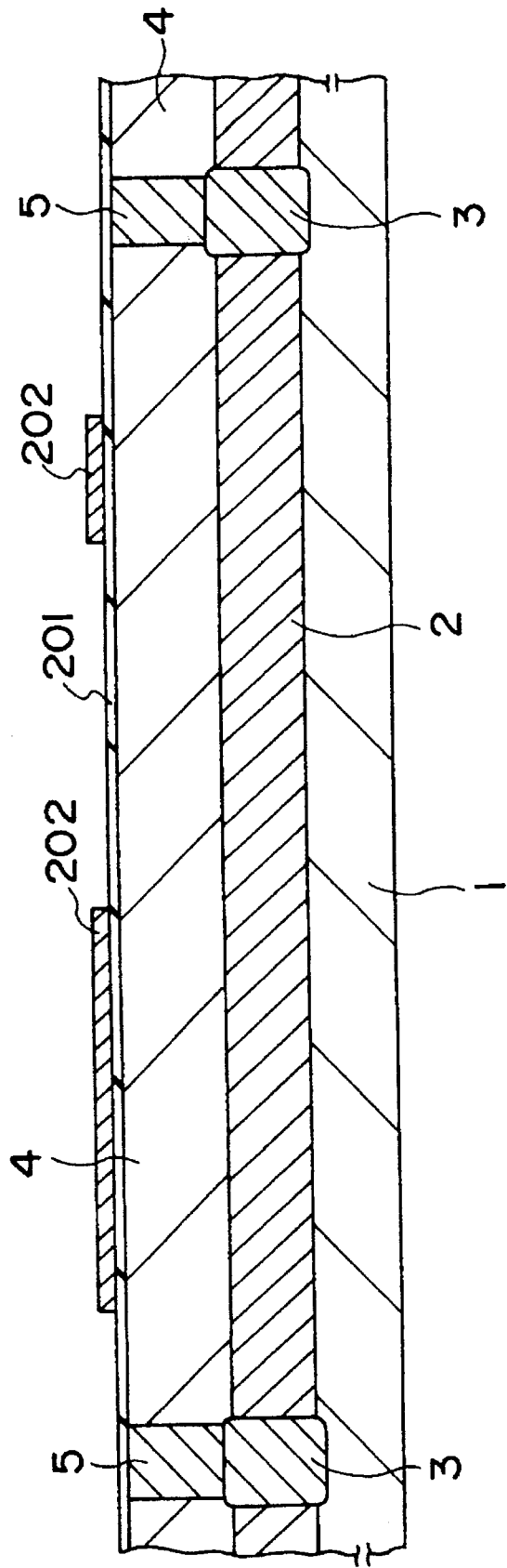
FIG. 2 is a sectional view for explaining a step in manufacturing the bipolar transistor shown in FIG. 1.
Figure 3:
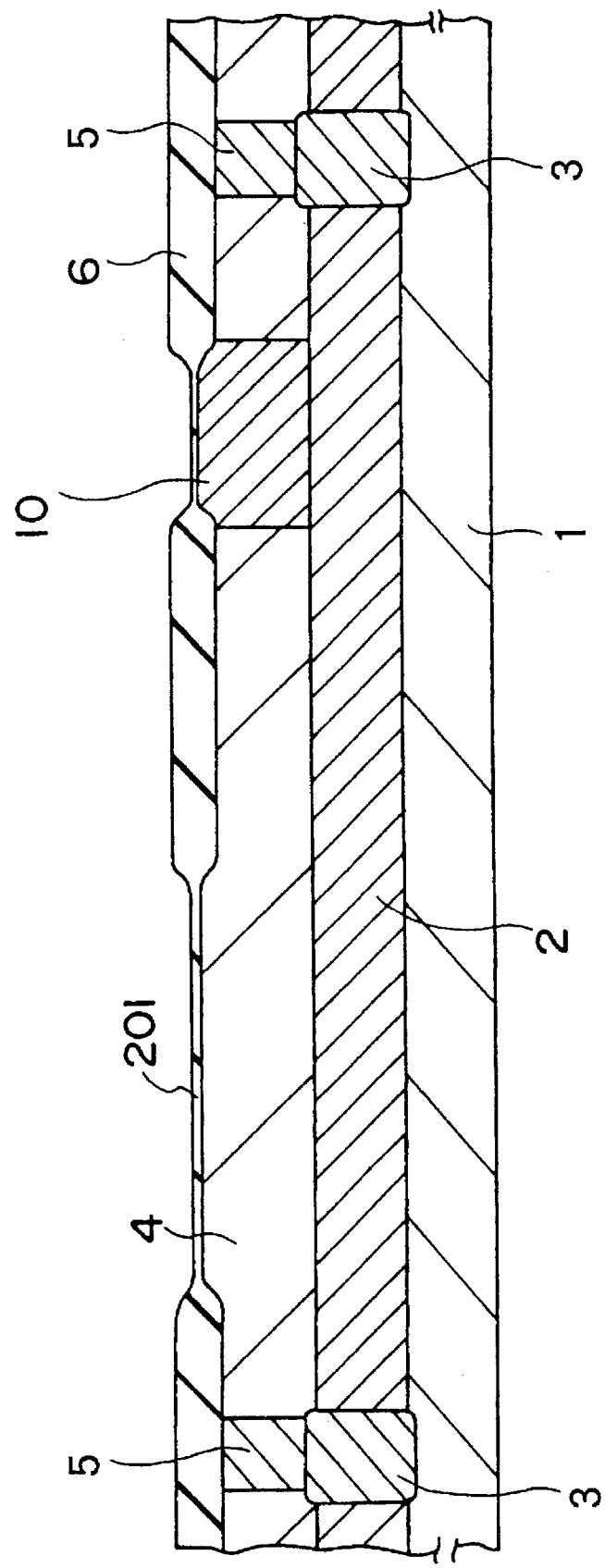
FIG. 3 is a sectional view for explaining a step in manufacturing the bipolar transistor shown in FIG. 1 and shows the step following the step shown in FIG. 2.
Figure 4:
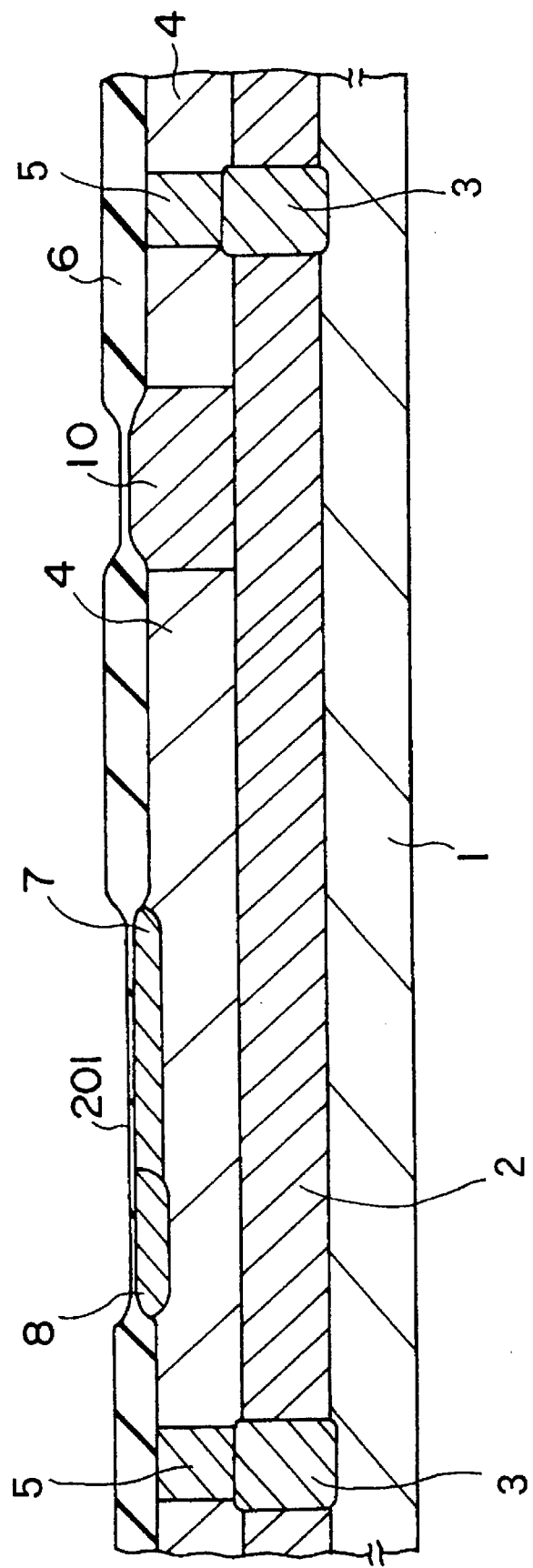
FIG. 4 is a sectional view for explaining a step in manufacturing the bipolar transistor shown in FIG. 1 and shows the step following the step shown in FIG. 3.
Figure 5:
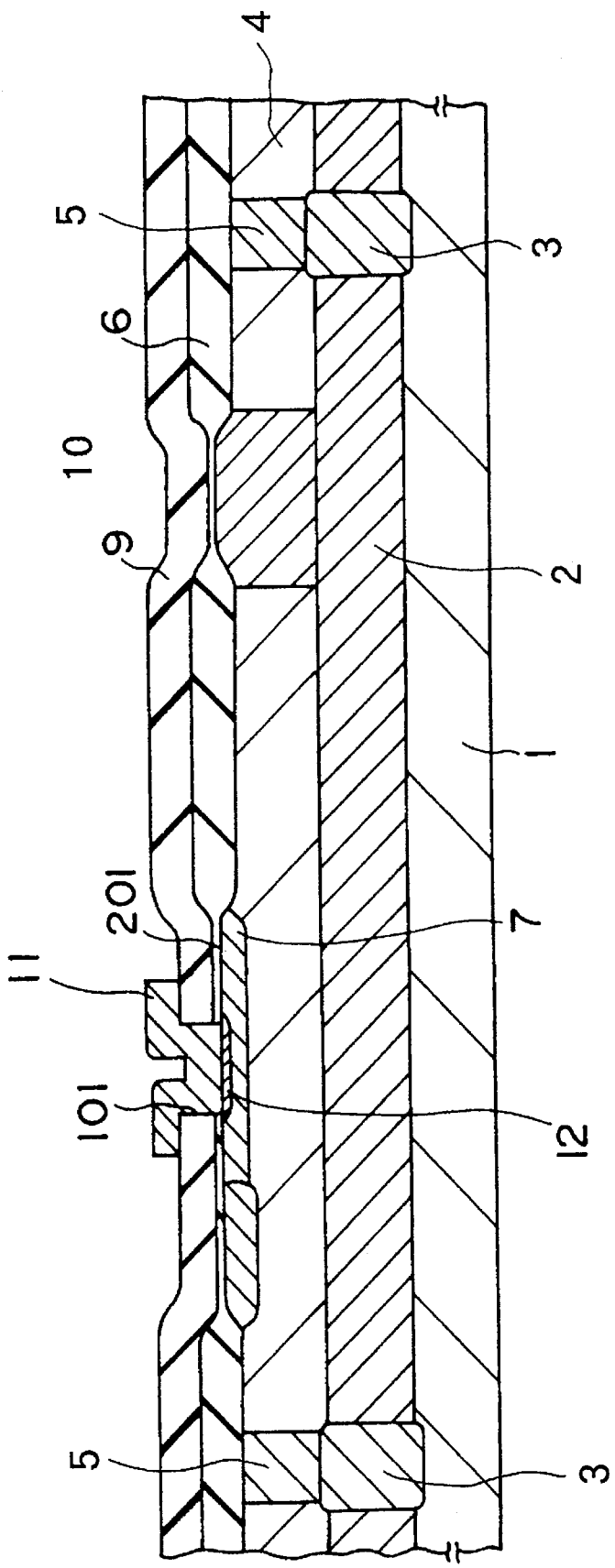
FIG. 5 is a sectional view for explaining a step in manufacturing the bipolar transistor shown in FIG. 1 and shows the step following the step shown in FIG. 4.

The step shown in FIG. 13 corresponds to the step, shown in FIG. 4, of the series of manufacturing steps of the first prior art shown in FIG. 1. According to the present invention, the step corresponding to the step shown in FIG. 3 of the first prior art is not required. For this reason, a photomask required in the step shown in FIG. 3 is not required, and the number of steps is decreased by one because the step shown in FIG. 3 is not required.

Figure 14:
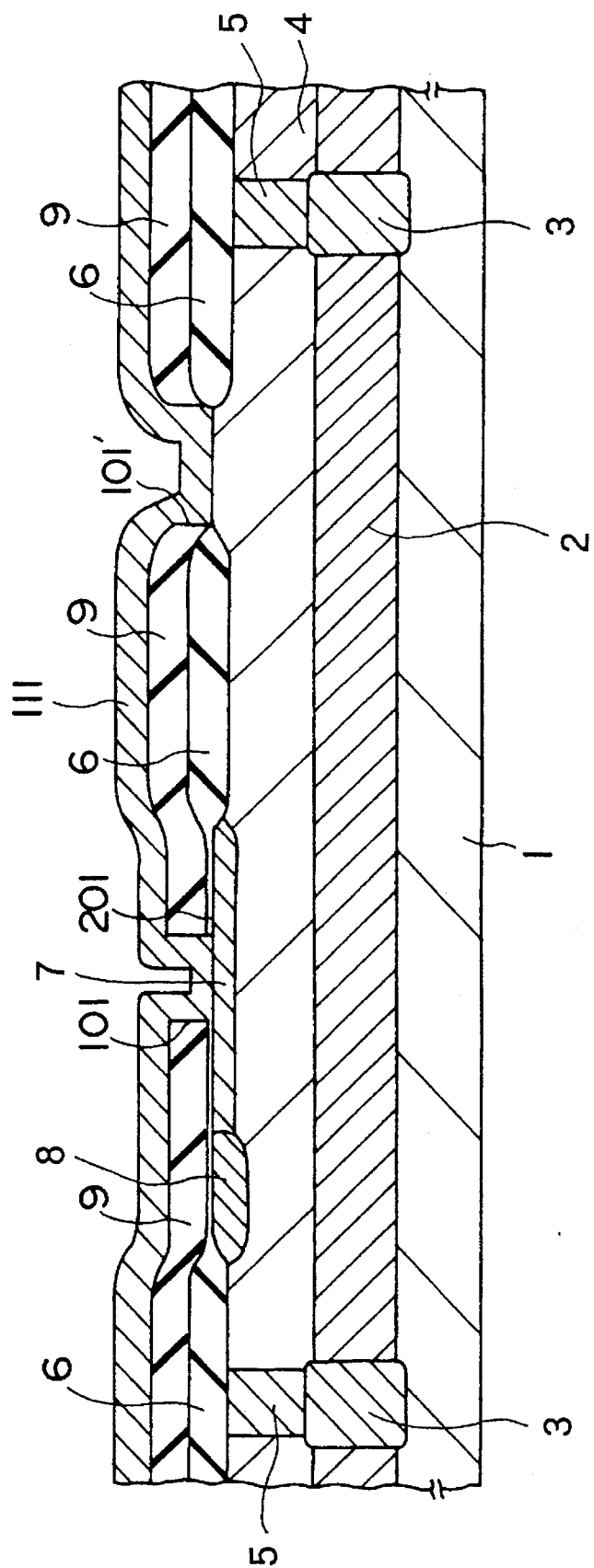
FIG. 14 is a sectional view for explaining a step in manufacturing the bipolar transistor shown in FIG. 10 and shows the step following the step shown in FIG. 13.

FIG. 14 shows the step following the step shown in FIG. 13.

Subsequently, the insulating interlayer 9 is formed on the entire surfaces of the oxide film 201 and the field oxide film 6. This insulating interlayer 9 is constituted by an oxide film deposited by, e.g., a CVD method. The insulating interlayer 9 and the oxide film 201 in the emitter formation region and collector formation region of the bipolar transistor are etched by a photolithographic technique to form the emitter electrode layer contact hole 101 and a collector region hole 101'. This etching is performed by anisotropic etching such as RIE.

A polysilicon film 111 having a thickness of about 200 nm is deposited on the insulating interlayer 9 and in the emitter electrode layer contact hole 101 and the collector region hole 101' by, e.g., a CVD method.

Figure 15:
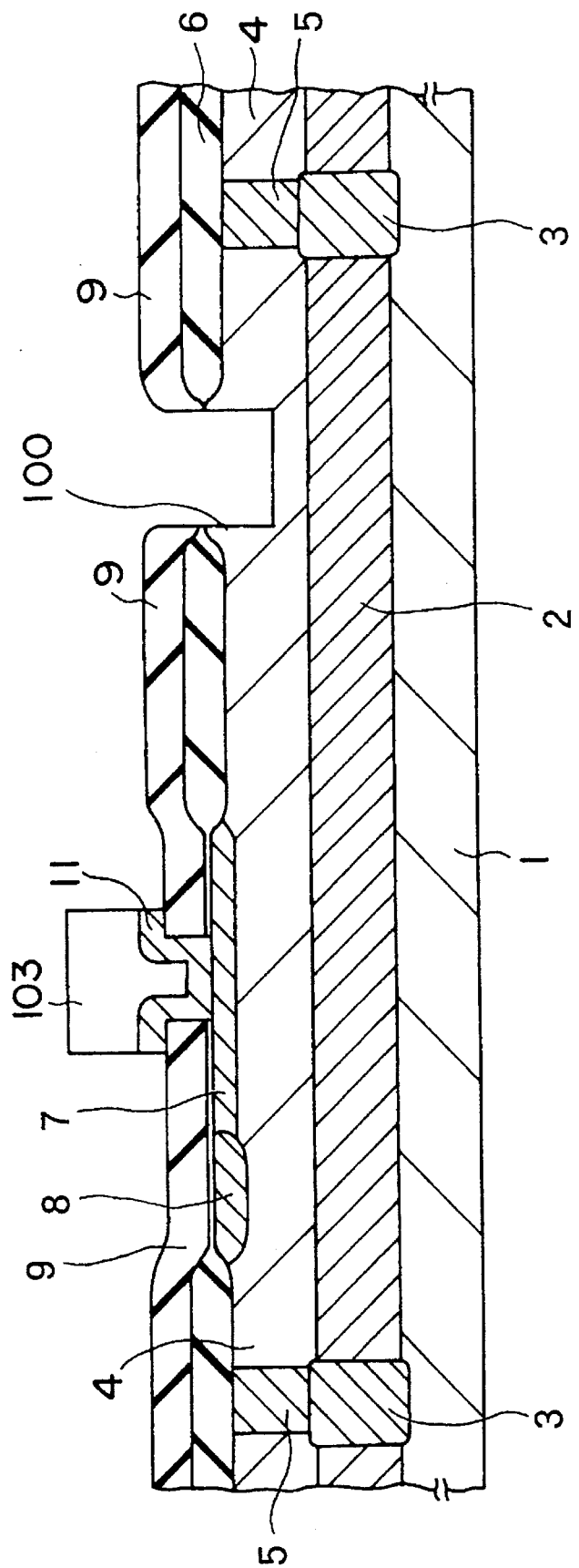
FIG. 15 is a sectional view for explaining a step in manufacturing the bipolar transistor shown in FIG. 10 and shows the step following the step shown in FIG. 14.

FIG. 15 shows the step following the step shown in FIG. 14.

Subsequently, the polysilicon film 111 is patterned by a photolithographic technique to leave a photoresist 103 in only the emitter formation region, and the remaining polysilicon film is used as the emitter electrode layer 11. In this etching, the portion of the collector region hole 101' in the collector formation region is not masked with the photoresist film. For this region, when overetching is performed when the emitter electrode layer 11 is patterned, the insulating interlayer 9 serves as a mask, and only the n-type epitaxial layer 4 in the collector formation region is removed by etching, thereby forming the collector groove 100. Note that, when this etching is performed at an $SiCl_4$ flow rate of 15 sccm, an $SF_6$ flow rate of 5 sccm, an $N_2$ flow rate of 5 sccm, and a power of 500 Watts, the etching can be performed while the selectivity ratio of the n-type epitaxial layer 4 to the insulating interlayer 9 can be kept sufficiently high. In addition, the collector groove 100 can be formed to have a depth of about 0.5 to 1.0 μm.

Figure 16:
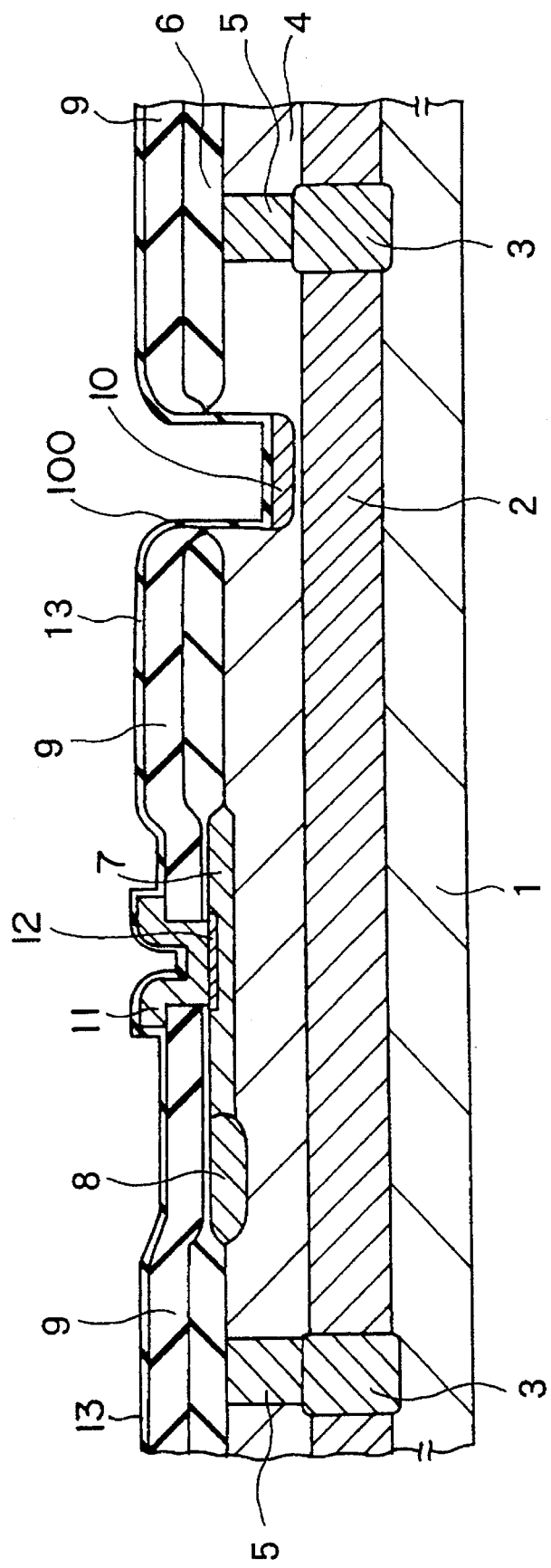
FIG. 16 is a sectional view for explaining of step in manufacturing the bipolar transistor shown in FIG. 10 and shows the step following the step shown in FIG. 15.

FIG. 16 shows the step following the step shown in FIG. 15.

Subsequently, after the photoresist film 103 is removed, for example, arsenic is ion-implanted in the resultant structure at an acceleration energy of 70 keV and a dose of $1\times10^{16}$ $cm^{-2}$ to dope an n-type impurity in the emitter electrode layer 11 and the bottom surface portion of the collector groove 100. Thereafter, the resultant structure is annealed in, e.g., a nitrogen atmosphere at 900° C. for 20 minutes to diffuse the n-type impurity doped in the emitter electrode layer 11 to the major surface portion of the p-type diffusion region 7, thereby forming the n-type emitter region 12 and forming the n-type collector diffusion region 10 of the collector formation region.

The insulating interlayer 13 is formed on the entire surfaces of the insulating interlayer 9 and the emitter electrode layer 11.

Figure 17:
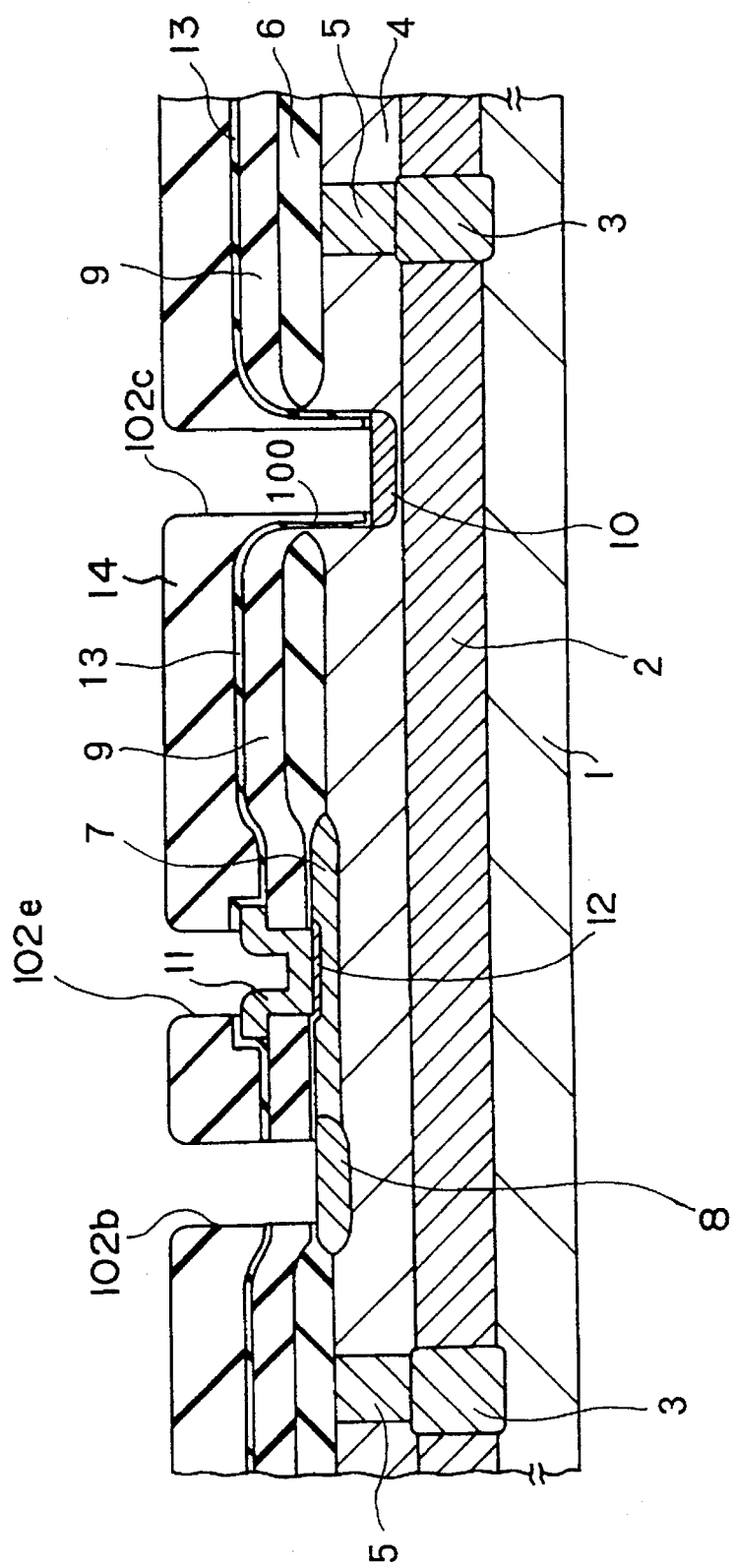
FIG. 17 is a sectional view for explaining a step in manufacturing the bipolar transistor shown in FIG. 10 and shows the step following the step shown in FIG. 16.

FIG. 17 shows the step following the step shown in FIG. 16.

Subsequently, the insulating interlayer 14 is formed on the entire surface of the insulating interlayer 13. The insulating interlayers 13 and 14 are formed as a film having a two-layered structure obtained by sequentially stacking, e.g., an oxide film and a BPSG (borophosphosilicate glass) film.

In the base formation region of the bipolar transistor, the insulating interlayer 14, the insulating interlayer 13, the insulating interlayer 9, and the oxide film 201 are etched using a photolithographic technique to form the base contact hole 102b. In the emitter formation region of the bipolar transistor, the insulating interlayer 14 and the insulating interlayer 13 are etched using a photolithographic technique to form the emitter contact hole 102e. In addition, in the collector formation region of the bipolar transistor, the insulating interlayer 14 and the insulating interlayer 13 are etched using a photolithographic technique to form the collector contact hole 102c.

Subsequently, as shown in FIG. 10, metal films consisting of TiN, TiW, W, or the like and serving as the adhering layers 15b, 15c, and 15e are formed in the base contact hole 102b, the emitter contact hole 102e, and the collector contact hole 102c, and on the surface of the insulating interlayer 14. Thereafter, tungsten nuclei are generated by a monosilane reduction method using $WF_6$.

The resultant structure is heated to a temperature of 400° C. or more, and tungsten is deposited on the adhering layers 15b, 15c, and 15e by a hydrogen reduction method using $WF_6$ at a pressure of about 1 Torr. The deposited tungsten is etched using the well-known dry-etching technique to leave the tungsten in only the base contact hole 102b, the emitter contact hole 102e, and the collector contact hole 102c, thereby forming the base-buried tungsten layer 16b, the emitter-buried tungsten layer 16e, and the collector-buried tungsten layer 16c. In place of tungsten, a metal such as titanium or molybdenum or a metal silicide such as titanium silicide or molybdenum silicide can be used.

Finally, an aluminum alloy is deposited on the entire surface of the resultant structure by, e.g., a sputtering method to form the base wiring layer 17b, the emitter wiring layer 17e, and the collector wiring layer 17c.

Figure 18:
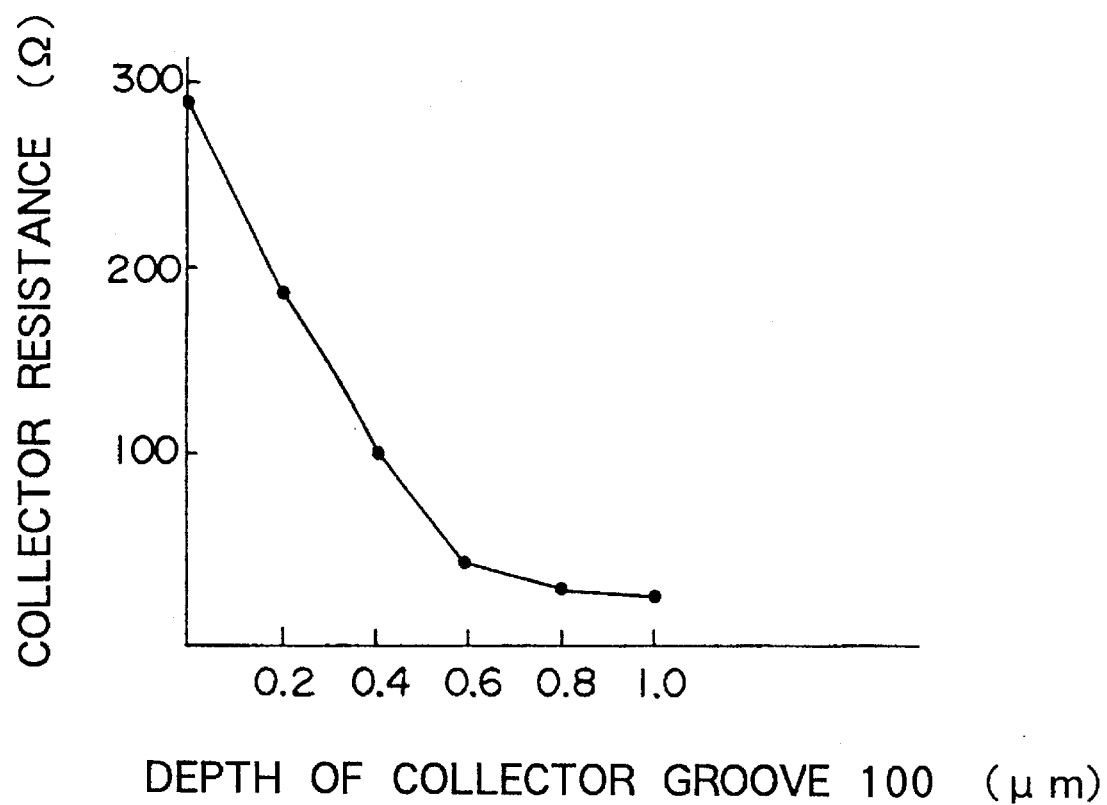
FIG. 18 is a graph for explaining the effect of the collector groove shown in FIG. 10.

FIG. 18 is a view for explaining the effect of the collector groove 100 shown in FIG. 10. In FIG. 18, the abscissa represents the depth of the collector groove 100, and the ordinate represents a collector resistance.

As shown in FIG. 18, the collector resistance is almost 300 Ω when no collector groove 100 is formed. However, when the depth of the collector groove 100 is set to be 0.4 μm or more, the collector resistance can be set to be 100 Ω or less.

Figure 19:
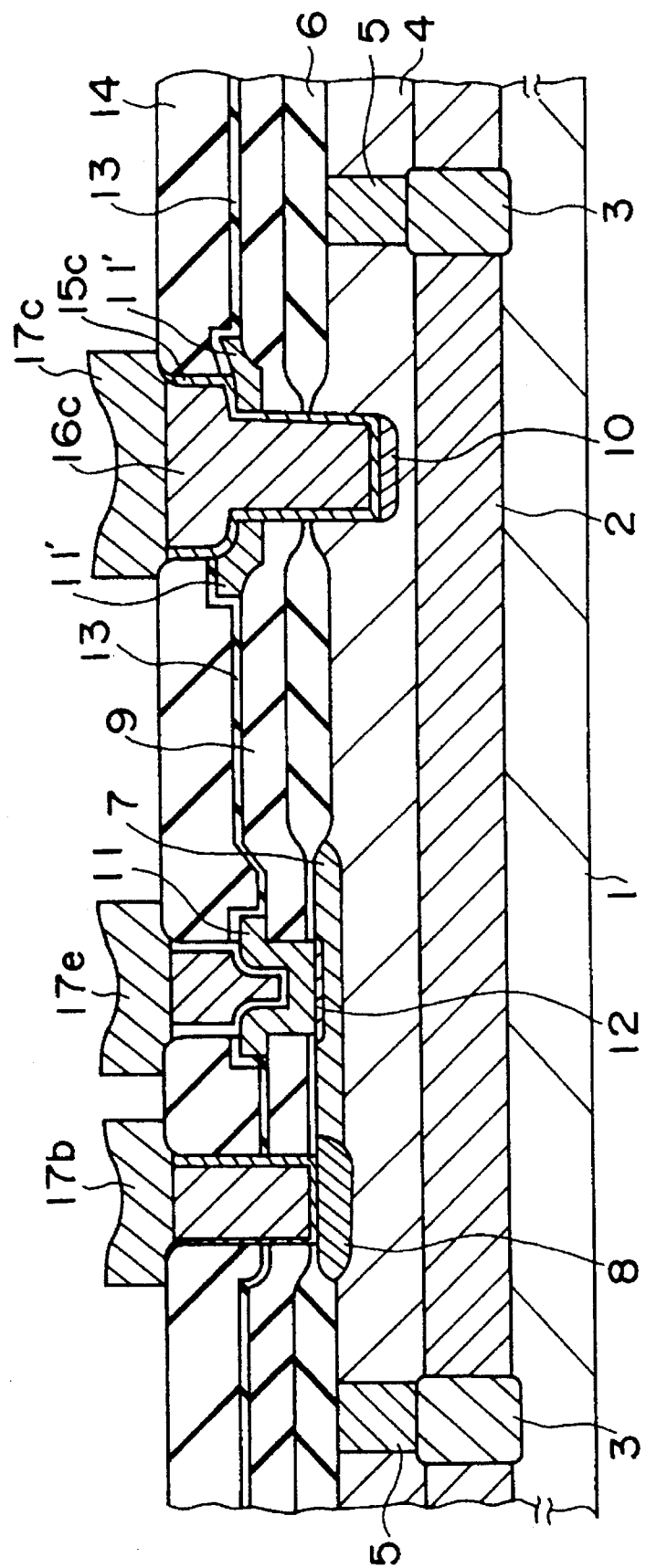
FIG. 19 is a sectional view showing a bipolar transistor according to the second embodiment of the present invention.

FIG. 19 is a sectional view showing a bipolar transistor according to the second embodiment of the present invention.

The same reference numerals as in FIG. 10 denote the same parts in FIG. 19. Referring to FIG. 19, reference numeral 11' denotes a polysilicon electrode.

The structure of the bipolar transistor shown in FIG. 19 will be described below.

Since the manufacturing steps of the second embodiment are the same as those of the first embodiment up to the step shown in FIG. 14, the steps following the step shown in FIG. 14 will be described below.

Figure 20:
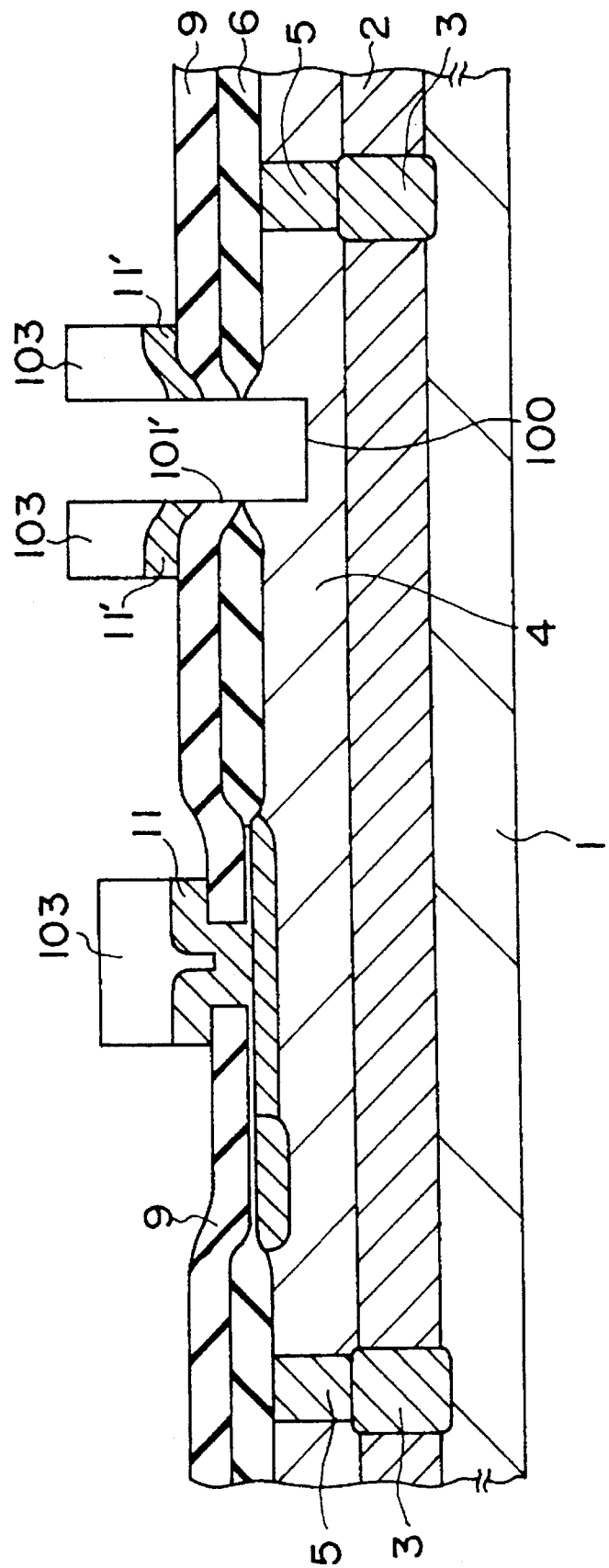
FIG. 20 is a sectional view for explaining a step in manufacturing the bipolar transistor shown in FIG. 19 and shows the step following the step shown in FIG. 14.

FIG. 20 shows the step following the step shown in FIG. 14.

When the manufacturing step shown in FIG. 14 is finished, a polysilicon film 111 is patterned by a photolithographic technique to leave a photoresist film 103 in only an emitter formation region and part of a collector formation region. The polysilicon film left in the emitter formation region is used as an emitter electrode layer 11, and the polysilicon film left in the part of the collector formation region is used as the polysilicon electrode 11'.

In this etching, the portion of a collector region hole 101' in the collector formation region is not masked with the photoresist film. For this reason, as in the case shown in FIG. 15, when overetching is performed when the emitter electrode layer 11 and the polysilicon electrode 11' are patterned, an insulating interlayer 9 serves as a mask, and only an n-type epitaxial layer 4 in the collector formation region is removed by etching so as to form a collector groove 100. Note that, when this etching is performed at an $SiCl_4$ flow rate of 15 sccm, an $SF_6$ flow rate of 5 sccm, an $N_2$ flow rate of 5 sccm, and a power of 500 W, the etching can be performed while the selectivity ratio of the n-type epitaxial layer 4 to the insulating interlayer 9 can be kept sufficiently high. In addition, the collector groove 100 can be formed to have a depth of about 0.5 to 1.0 μm.

Figure 21:
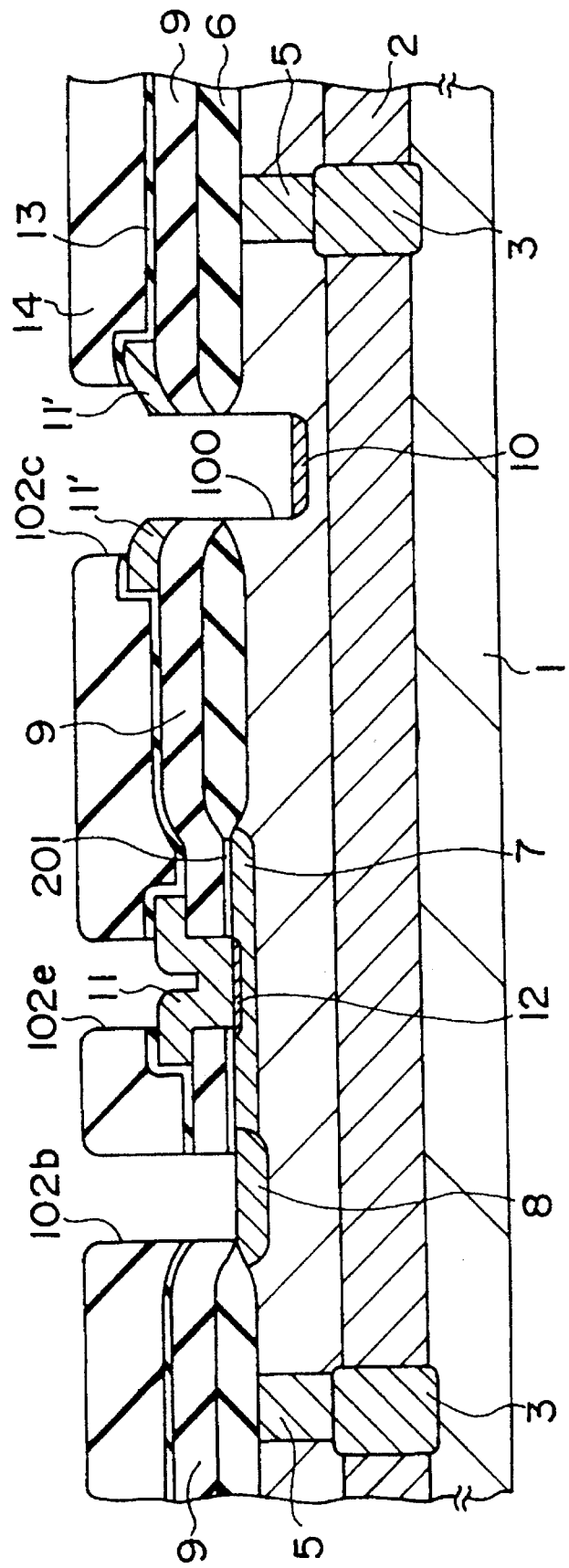
FIG. 21 is a sectional view for explaining a step in manufacturing the bipolar transistor shown in FIG. 19 and shows the step following the step shown in FIG. 20.

FIG. 21 shows the step following the step shown in FIG. 20.

Subsequently, after the photoresist film 103 is removed, for example, arsenic is ion-implanted in the resultant structure at an acceleration energy of 70 keV and a dose of $1\times10^{16}$ $cm^{-2}$ to dope an n-type impurity in the emitter electrode layer 11 and the bottom surface portion of the collector groove 100. Thereafter, the resultant structure is annealed in, e.g., a nitrogen atmosphere at 900° C. for 20 minutes to diffuse the n-type impurity doped in the emitter electrode layer 11 to the major surface portion of a p-type diffusion region 7, thereby forming an n-type emitter region 12 and forming an n-type collector diffusion region 10 of the collector formation region.

An insulating interlayer 13 is formed on the entire surfaces of the emitter electrode layer 11 and the polysilicon electrode 11' formed at the edge of the collector groove 100, and an insulating interlayer 14 is formed on the entire surface of the insulating interlayer 13. The insulating interlayers 13 and 14 are formed as a film having a two-layered structure obtained by sequentially stacking, e.g., an oxide film and a BPSG (borophosphosilicate glass) film.

Figure 6:
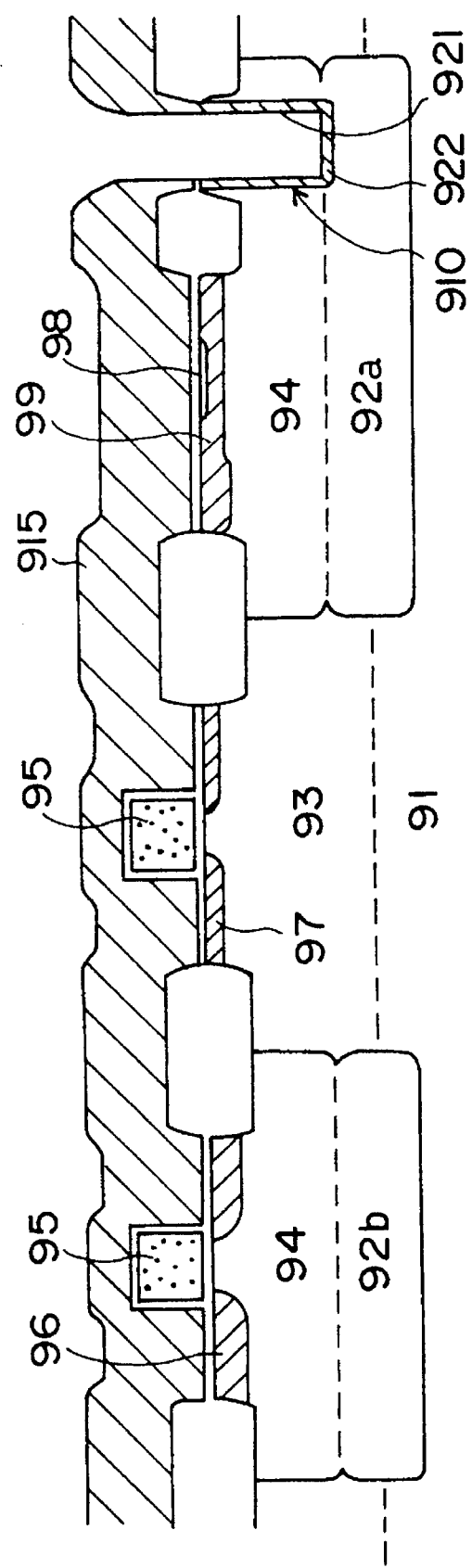
FIG. 6 is a sectional view for explaining a step in manufacturing a semiconductor device according to the second prior art.
Figure 7:
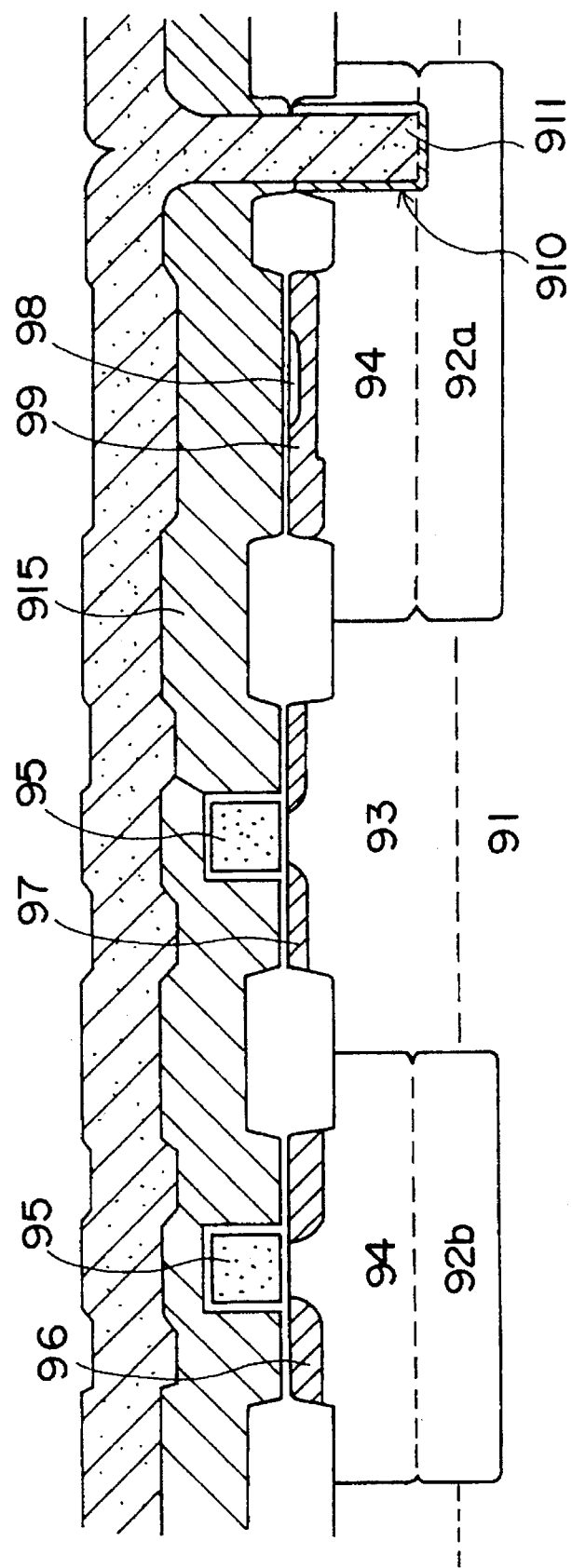
FIG. 7 is a sectional view for explaining a step in manufacturing the semiconductor device shown in FIG. 6 and shows the step following the step shown in FIG. 6.
Figure 8:
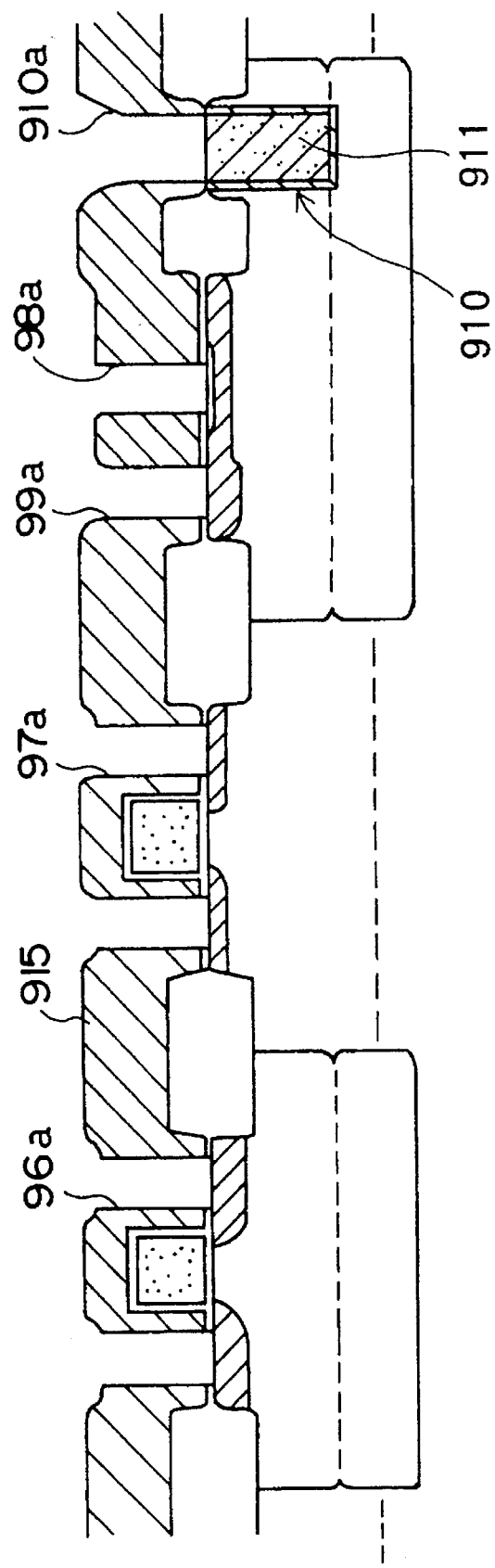
FIG. 8 is a sectional view for explaining a step in manufacturing the semiconductor device shown in FIG. 6 and shows the step following the step shown in FIG. 7.
Figure 9:
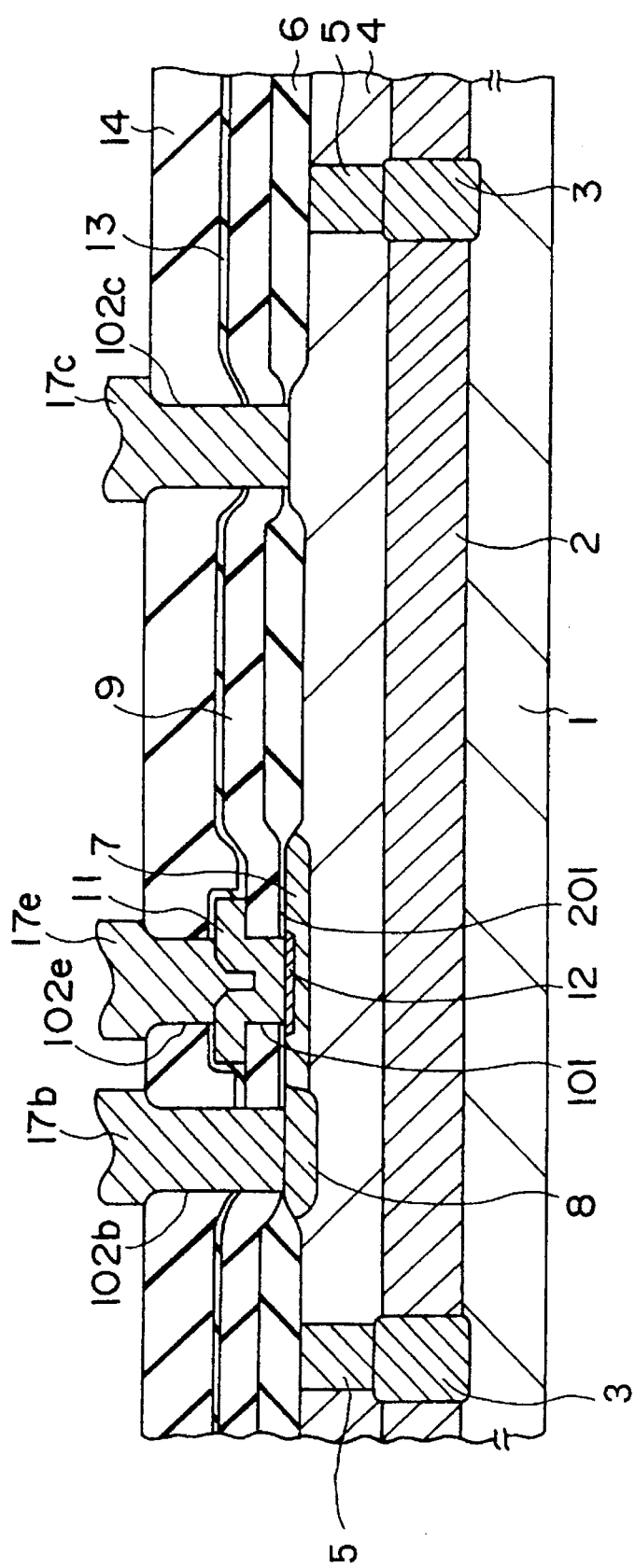
FIG. 9 is a sectional view showing the bipolar transistor obtained when the step of forming an n-type collector diffusion region is omitted in the first prior art shown in FIG. 1.

In the base formation region of the bipolar transistor, the insulating interlayer 14, the insulating interlayer 13, the insulating interlayer 9, and an oxide film 201 are etched using a photolithographic technique to form a base contact hole 102b. In the emitter formation region of the bipolar transistor, the insulating interlayer 14 and the insulating interlayer 13 are etched using a photolithographic technique to form an emitter contact hole 102e. In addition, in the collector formation region of the bipolar transistor, the insulating interlayer 14 and the insulating interlayer 13 are etched using a photolithographic technique to form a collector contact hole 102c. As shown in FIG. 21, the collector contact hole 102c is formed to have an edge located on the polysilicon electrode 11' and have a diameter larger than that of the collector groove 100. In this step, when the base contact hole 102b, the emitter contact hole 102e, and the Collector contact hole 102c are simultaneously formed, the manufacturing steps smaller in number than those of the second prior art, shown in FIGS. 6 to 8, in which the collector contact hole is formed independently of the emitter/base contact hole, can be obtained.

Since the steps following the step shown in FIG. 21 are the same as those of the first embodiment, a description thereof will be omitted. As a result, in the second embodiment, the bipolar transistor shown in the sectional view of FIG. 19 can be obtained.

Figures 22A, 22B:
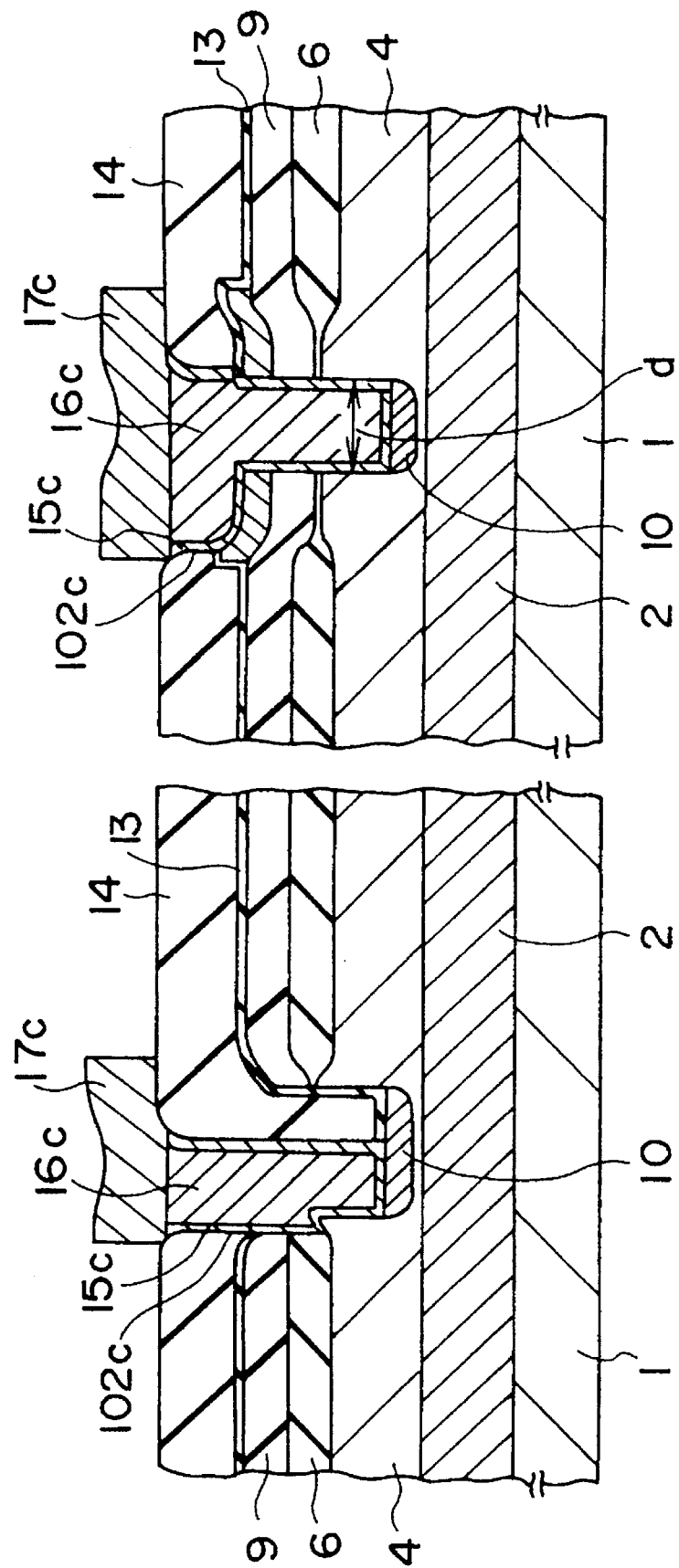
FIG. 22A is a sectional view showing the state wherein an alignment offset of a photomask occurs in formation of a collector contact hole in the first embodiment.
FIG. 22B is a sectional view showing the same state as in FIG. 22A in the second embodiment.

FIG. 22A shows a state wherein an alignment offset of a photomask occurs in formation of the collector contact hole 102c in the first embodiment of the present invention. FIG. 22B is a sectional view showing the same state as in FIG. 22A in the second embodiment of the present invention.

In the first embodiment, when an alignment offset of a photomask occurs in formation of the collector contact hole 102c, as shown in FIG. 22A, the effective connection area between the collector contact hole 102c and the semiconductor substrate decreases.

In the second embodiment, even when a small alignment offset of the photomask occurs, as shown in FIG. 22B, the effective connection area between the collector contact hole 102c and the semiconductor substrate does not decrease because a width d can be assured.

Note that the present invention is not limited to the above embodiments. For example, the present invention can be applied to a self-aligned bipolar transistor in which an emitter diffusion layer is self-aligned to a base electrode.

As has been described above, according to the present invention, the number of manufacturing steps can be reduced by one because the step of forming a photomask performed in the conventional manufacturing method can be omitted. In addition, since the step of burying a polysilicon layer in a collector groove and the step of doping an impurity are not required, the number of manufacturing steps can be considerably decreased.

According to the second embodiment, even when a small alignment offset of a photomask occurs in formation of the collector contact hole 102c, the effective connection area between the collector contact hole 102c and the semiconductor substrate will not decrease.

What is claimed is:

1. A method of manufacturing a semiconductor device having a collector of one conductivity type, a base of an opposite conductivity type, and an emitter of the one conductivity type which are formed on a semiconductor substrate, comprising the steps of:

doping an impurity of the one conductivity type in a major surface portion of said semiconductor substrate to form a buried layer of the one conductivity type and growing an epitaxial layer on an entire surface on a major surface of said semiconductor substrate;

forming a diffusion region of the opposite conductivity type in an emitter formation region on the major surface of said semiconductor substrate and forming a base connecting region in a base formation region in contact with said diffusion region of the opposite conductivity type;

forming an insulating interlayer on the major surface of said semiconductor substrate including said diffusion region of the opposite conductivity type and said base connecting region;

forming an emitter electrode contact hole reaching said diffusion region of the opposite conductivity type in the emitter formation region in said insulating interlayer and forming a collector region hole reaching said epitaxial layer in a collector formation region in said insulating interlayer;

depositing a polysilicon film on said insulating interlayer and in said emitter electrode contact hole and said collector region hole;

forming a patterning mask on said polysilicon film in said emitter formation region, patterning said patterning mask to leave a portion of said polysilicon film serving as an emitter electrode layer, and, at the same time, removing said epitaxial layer in said collector formation region by etching to form a collector groove; and doping an impurity of the one conductivity type in said emitter electrode layer and then diffusing the impurity of the one conductivity type to a major surface portion of said diffusion region of the opposite conductivity type to form an emitter region, and doping an impurity of the one conductivity type in at least a bottom surface portion of said collector groove and then diffusing the impurity of the one conductivity to said epitaxial layer to form a collector diffusion region.

2. A method of manufacturing a semiconductor device having a collector of one conductivity type, a base of an opposite conductivity type, and an emitter of the one conductivity type which are formed on a semiconductor substrate, comprising the steps of:

doping an impurity of the one conductivity type in a major surface portion of said semiconductor substrate to form a buried layer of the one conductivity type and growing an epitaxial layer on an entire surface on a major surface of said semiconductor substrate;

forming a diffusion region of the opposite conductivity type in an emitter formation region on the major surface of said semiconductor substrate and forming a base connecting region in a base formation region in contact with said diffusion region of the opposite conductivity type;

forming an insulating interlayer on the major surface of said semiconductor substrate including said diffusion region of the opposite conductivity type and said base connecting region;

forming an emitter electrode contact hole reaching said diffusion region of the opposite conductivity type in an emitter formation region in said insulating interlayer and forming a collector region hole reaching said epitaxial layer in a collector formation region in said insulating interlayer;

depositing a polysilicon film on said insulating interlayer and in said emitter electrode contact hole and said collector region hole;

forming a patterning mask on said polysilicon film in said emitter formation region and part of said collector formation region, patterning said patterning mask to leave portions of said polysilicon film serving as an emitter electrode layer and part of a collector electrode layer in said collector formation region, and, at the same time, removing said epitaxial layer in said collector formation region by etching to form a collector groove; and doping an impurity of the one conductivity type in said emitter electrode layer and then diffusing the impurity of the one conductivity type to a major surface portion of said diffusion region of the opposite conductivity type to form an emitter region, and doping an impurity of the one conductivity type in at least a bottom surface portion of said collector groove and then diffusing the impurity of the one conductivity to said epitaxial layer to form a collector diffusion region.

3. A method according to claim 1, wherein the step of forming a patterning mask on said polysilicon film in said emitter formation region, patterning said patterning mask to leave a portion of said polysilicon film serving as an emitter electrode layer, and, at the same time, removing said epitaxial layer in said collector formation region by etching to form a collector groove, comprises the step of forming a collector groove using dry etching having a selectivity ratio of said epitaxial layer to an insulating film under said emitter electrode layer.

4. A method according to claim 1, further comprising the step of simultaneously forming a base contact hole and a contact hole reaching a collector diffusion region formed deeper than the major surface of said semiconductor substrate, and the step of burying a metal or a metal silicide in said base contact hole and said contact hole reaching the collector diffusion region.

* * * * *